United States Patent [19]
Damiot

[11] Patent Number: 5,424,254
[45] Date of Patent: Jun. 13, 1995

[54] PROCESS FOR RECOVERING BARE SEMICONDUCTOR CHIPS FROM PLASTIC PACKAGED MODULES BY THERMAL SHOCK

[75] Inventor: Pascale Damiot, Cerny, France

[73] Assignee: International Business Machines Corporation, Armonk, N.Y.

[21] Appl. No.: 296,399

[22] Filed: Aug. 26, 1994

[30] Foreign Application Priority Data

Feb. 22, 1994 [EP] European Pat. Off. ............ 94480015

[51] Int. Cl.⁶ ............................................. H01L 21/66
[52] U.S. Cl. .................................... 437/243; 437/248; 437/923; 437/974
[58] Field of Search ................. 437/243, 248, 923, 974

[56] References Cited

FOREIGN PATENT DOCUMENTS

| | | |
|---|---|---|
| 55-163855 | 12/1980 | Japan . |
| 57-20478 | 8/1983 | Japan . |
| 63-184347 | 7/1988 | Japan . |
| 2-301144 | 12/1990 | Japan . |
| 4184957 | 7/1992 | Japan .................................. 437/923 |

OTHER PUBLICATIONS

Novus Technologies, Inc. Promotional Literature; (no date) 1423 San Rafael, Avenue Ne P.O. Box 53416.
ICOM Corporation Promotional Literature; No. Date 734 Slver Spur Rd., Ste. 201, Rolling Hills Estates, Calif. 90274
H. H. Blake, et al. "Technique for Observing Interfacial Filsm", IBM Technical Disclosure Bulletin, vol. 26, #1, pp. 648–650, Jul. 1983.
"Electronic Circuits–Preserving Technique for Decapsulating Plastic Packages" IBM Technical Disclosure Bulletin, vol. 30, #6, Nov. 1987.
"High Precision Polishing Technique to Open Electronic Components" vol. 33, #1A, pp. 305–306, Jun. 1990.

*Primary Examiner*—Olik Chaudhuri
*Assistant Examiner*—David E. Graybill
*Attorney, Agent, or Firm*—Susan M. Murray

[57] ABSTRACT

The method of the present invention is particularly directed to plastic packaged modules of the type wherein the contact zones of the chip are connected by wire-bonding to lead conductors and wherein the chip is molded in etch resistant resins. The opening method includes the steps of: a) polishing the module topside to eliminate the top part of the plastic encapsulating resin until the conductors of the lead frame are exposed; b) removing the lead frame; c) roughly polishing the module backside to eliminate the bottom part of the plastic encapsulating resin until the passive face of the silicon chip is exposed; d) immersing the resulting module in a hot fuming nitric acid bath raised to a temperature of about 120° C. and for a time of about 8 minutes; and, e) immediately cooling the resulting module by blowing compressed ambient temperature air thereon to create a thermal shock whereby all the remaining parts of the plastic encapsulating resin are eliminated, leaving the desired bare silicon chip without damage.

24 Claims, 5 Drawing Sheets

PROCESS FOR RECOVERING BARE SEMICONDUCTOR CHIPS FROM PLASTIC PACKAGED MODULES BY THERMAL SHOCK

FIELD OF INVENTION

The present invention relates to plastic encapsulated semiconductor chips and more particularly to an opening method for recovering a bare semiconductor chip from the plastic packaged modules wherein a chip is encapsulated without any damage for the chip. As a result, the method allows recovery of fully functional and testable chips for any purpose, e.g. for examination-/inspection, analysis, or re-use (possibly after repair). The method of the present invention is applicable to any plastic packaged modules even when the semiconductor chip is molded in a plastic encapsulating resin which is resistant to known etching techniques.

BACKGROUND OF THE INVENTION

Plastic package decapsulation (or depacking) is absolutely necessary for construction analysis and failure analysis of plastic packaged components, typically semiconductor chips. Especially in the case of failure analysis, identification of the cause of a defective chip implies that the opening method keeps the full integrity of the devices integrated in the chip and of the metallic interconnections as well. Likewise, it is often necessary to physically evaluate VLSI devices for the purpose of product reliability, validation of physical design and identification of device structural patterns. Finally, at the present time, high volume supplies of verifiable bare chips are spotty in the merchant market since some suppliers will not even sell bare chips. This situation has forced some module manufacturers to purchase packaged chips and to remove the chips for re-use at considerably increased costs. Bare chip quality is the major issue of these module manufacturers, because they do not want to find themselves recovering chips not fully functional for re-use. As a result, in addition to functionality aspects, chip testability is also an essential concern, because the opening method must not only let the chip remain functional but also remain in good condition for the test. Therefore, the basic problem to be solved is to develop a reliable method to open plastic packaged modules to recover the bare semiconductor (typically silicon) chip enclosed therein without altering its physical and electrical integrity.

Wet chemical methods using hot fuming nitric acid are extensively used with silicon nitride (Si3N4) and/or silicon dioxide (SiO2) passivated silicon chips. When the silicon chip is passivated with polyimide, these methods are inoperative because nitric acid damages the polyimide material and thus does not preserve chip functionality (in case of polyimide passivation only manual polishing is used). A more specific problem has recently emerged with SiO2/Si3N4 passivated silicon chips, when very hard, etch resistant plastic resins are used as the molding compound to encapsulate the chip. For instance, the TOSHIBA "KE 2000H" plastic resin belongs to this category. This plastic resin has outstanding properties in terms of hermeticity, reliability, and purity (absence of contaminants). Unfortunately, the complete removal of this plastic resin without damaging the encapsulated chip is a very difficult task because the hard plastic resin is totally unattackable by any acid including hot fuming nitric acid.

FIG. 1 shows a conventional plastic packaged module of the SOJ (Small Outline J-Lead) model wherein a silicon chip is molded. FIG. 1 (A) shows a cutaway view of the plastic packaged module with a part of the plastic encapsulation removed, (B) shows a cross sectional view of the module, and (C) shows a schematic enlarged view at the vicinity of the chip terminal connection system. Now turning to FIG. 1 there is shown a conventional plastic packaged module 10 incorporating a silicon chip 11 whose active surface is mounted facing up. The packaged module 10 has a plurality of lead frame conductors 12 extending through the plastic encapsulating resin 13 which are adhesively joined to the silicon chip 11, preferably by means of a composite polymeric layer 14. Typically, this composite layer consists of a sandwich formed by a bottom polyimide polymeric layer 14a glued to an alpha barrier layer 14b. The alpha barrier layer is a film of a polymer material having a melting temperature above 175° C. and does not contain ionizable species. One such polymer material that can be used as an alpha barrier is "KAPTON" (a trademark of DuPont). A 30 um diameter gold wire 15 is thermosonically bonded between each lead frame conductor 12 and a contact zone 19 of the chip. In addition, this composite polymeric layer 14 may reveal to be useful should the lead frame conductors dissipate excess heat that could damage the chip.

A more detailed construction at the vicinity of the terminal connection system where the gold wire 15 is attached to the chip 11 is shown in the enlarged view (C) of FIG. 1. Now turning to FIG. 1(C), there is illustrated a standard silicon chip 11 consisting of a silicon substrate 16 (wherein active/passive devices are formed) up to the phosphosilicate glass (PSG) insulating layer including the tungsten studs (not shown). The first metallization level (M1) is represented by land 17. A passivating layer 18 is formed thereon. Typically, according to the scope of the present invention, this passivating layer 18 is made of an inorganic material such as silicon nitride Si3N4 and/or silicon dioxide SiO2, as known by those skilled in the art. The passivation layer 18 is provided with an opening or via-hole. The second level of metallization (M2) is formed in this via-hole and results in a contact zone 19 where the gold wire 15 is bonded. For instance, according to an advanced CMOS technology used to manufacture 16 Mbits DRAM chips, the first and second metallization levels consist of a composite metallurgy: Ti-AlCuSi-TiN-Si and Ti-AlCuSi-TiN respectively. The other end of the gold wire 15 is bonded to one of the inner lead or lead frame conductor 12 (not shown). When the gold wire 15 is thermosonically bonded to the chip contact zone 19, there is formed a ball-shaped connection 20.

With continued reference to FIG. 1, the chip contact zones 19 are preferably located along a center area of the chip 11 along the longitudinal axis. As such, the plastic packaged module 10 of FIG. 1, is very attractive in many respects. In addition to its role of serving as an alpha barrier, the composite polymeric layer 14 cooperates lead frame conductors 12 (which cover a substantial portion of the chip surface) to facilitate the dissipation of heat generated by the chip. Moreover, the short connecting wires 15 contribute to faster chip response. This particular chip/packaging combined technology is described and claimed in commonly assigned U.S. Pat. Nos. 4,796,098 and 4,862,245. This technology is extensively used for the packaging of 1, 4 and 16 Mbits DRAM chips (in this latter case, the central area containing the chip contact zones is transverse instead of being longitudinal as illustrated in FIG. 1) and is currently designated under the brand name of A-wire (A stands for Area-window).

DESCRIPTION OF A METHOD OF THE PRIOR ART

The different processing steps of a conventional opening method that is capable of removing hard molding resins, such as the TOSHIBA "KE 2000H" (which is extensively used for the encapsulation of the advanced semiconductor memory products mentioned above), will now be described in conjunction with FIGS. 2 and 3.

FIG. 2 illustrates the module 10 of FIG. 1 at various stages of the opening method. FIGS. 3(A) and 3(B) are microphotographs showing enlarged views at the vicinity of the chip terminal connection system before and after plasma etching. It is noteworthy to remark that hot fuming nitric acid is never used in the conventional opening method for opening modules encapsulated in hard molding resins.

1) The top face of the module 10 of FIG. 1 is roughly polished using a metal grinding disk (granularity 60 um, 300 rpm) and a conventional manual polisher, such as the "PRESI Mecapol P 250", until the lead frame is reached. Preferably, this step must be monitored not to polish the top surface in excess such that it would destroy the terminal connection system. It is recommended to adjust planarity of the module top surface with respect to the disk during this polishing step. The resulting module is shown in FIG. 2(A).

2) The lead frame is then removed from the module 10 simply using a pair of tweezers. The resulting module is shown in FIG. 2(B)

3) The polishing is continued to remove the composite polymeric layer 14. The same metal grinding disk of step 1 is used to remove the "KAPTON" top layer 14b. The bottom polyimide layer 14a is preferably removed by a metal disk having a smaller granularity e.g. 9 um. This polishing step must be very carefully monitored and must be stopped before the protective passivating layer 18 is attacked. The resulting module is shown in FIG. 2(C). Because the plastic encapsulating plastic resin 13 is much harder than the polymeric material of layer 14, once the latter has been totally removed, there still remains a small quantity of the plastic encapsulating resin 13 coating the central area of the chip which is detrimental to chip analysis, in particular because it prevents visual chip inspection. Micro-photograph of FIG. 3(A) illustrates the pad-shaped portion of the ball-shaped connection 20 embedded in a plastic resin coating which remains after the polishing steps.

4) The removal of this remaining plastic resin coating generally requires two sub-steps, a first relatively coarse polishing and a fine O2 plasma etching. The latter sub-step must be conducted in the shortest possible time, because inorganic materials are known to be sensitive to O2 plasmas.

In sub-step 4-1, the module top surface is softly polished with a cloth disk (gran. 6 um) and a polishing paste ("Buehler Diamond". . . ) to remove the greatest part of this remaining plastic resin coating. Likewise, care must be exercised to avoid any scratch of the underlying passivating layer 18, to preserve chip functionality.

In sub-step 4-2, the top surface of the resulting module is submitted to plasma etching in an O2 environment in a RIE etcher for isotropic etch. This step must be also carefully monitored. The etching time must be sufficient to remove all the remaining plastic resin coating but not too long to avoid damaging the passivating layer 18. An adequate RIE system to perform this sub-step is the "PLASSYS MDS 150". Major operating parameters are a power of 850 W and an O2 flow of 20 cc in two cycles of 30 minutes. Finally, the chip is rinsed in de-ionized water. As apparent from FIG. 2(D), at this stage of the process, the chip is still partially molded in the plastic resin which encapsulates the passive face and the sidewalls of the chip 11. The micro-photograph of FIG. 3(B) illustrates the pad-shaped portion which remains bonded to the chip contact zone at this final stage of the process (when successfully completed).

This conventional opening method has some inconveniences. The polishing steps which aim to remove the polymeric layer 14 and at least partially, the remaining plastic resin coating must be very accurately controlled, to avoid destruction of the chip terminal connection system (whose integrity is required for testability) and the damaging of the passivating layer (for chip device functionality). In addition, according to this method, a plasma etching step is necessary requiring thereby expensive Plasma RIE etcher. This plasma etching sub-step is relatively long (1 H processing time) and requires an accurate control, because the oxygen plasma is prone to attack the SiO2/Si3N4 chip passivating layer 18. In fact, it is impossible to remove all the remaining plastic encapsulating resin coating in the central area, so that chip testability is always less than 10%. Moreover, this step has been generally noticed to have detrimental contamination effects. Contamination arises because of the presence of the surrounding plastic which causes pollution of the RIE etcher internal walls, and subsequently will pollute the SEM tool as well. As a final result, the above described conventional opening method raises many concerns: results are operator dependent, the success rate is low, sample preparation time is long and the terminal connection systems are often destroyed. Moreover, this method becomes more difficult when the size of the chips increases which means a predictable inefficiency of the subject method in the near future. Consequently, this conventional opening method is not satisfactory in many respects.

OBJECTS OF THE INVENTION

It is therefore a primary object of the present invention to provide a method for recovering bare semiconductor chips from plastic packaged modules which is not detrimental to the chip functionality and testability.

It is another object of the present invention to provide a method for recovering bare semiconductor chips from plastic packaged modules which permits complete removal of the plastic encapsulating resin.

It is another object of the present invention to provide a method for recovering bare semiconductor chips from plastic packaged modules which preserves the terminal connection system integrity.

It is another object of the present invention to provide a method for recovering bare semiconductor chips from plastic packaged modules which is applicable to any type of plastic encapsulating resin.

It is still another object of the present invention to provide a method for recovering bare semiconductor chips from plastic packaged modules which is simple and inexpensive.

It is another object of the present invention to provide a method for recovering bare semiconductor chips from plastic packaged modules which does not cause any contamination to the chip and processing/inspection equipments.

It is still another object of the present invention to provide a method for recovering bare semiconductor chips from plastic packaged modules which can be fully automated.

SUMMARY OF THE PRESENT INVENTION

The opening method of the present invention aims to recover undamaged bare silicon chips from plastic packaged modules wherein they are molded. For plastic packaged modules of the type where the chip has its contact zones wire-bonded to the conductors of a lead frame and is molded in a plastic encapsulating resin which is etch resistant to hot fuming nitric acid, the opening method basically includes the steps of:

1) polishing the module upside until the lead frame is exposed;
2) removing the lead frame;
3) roughly polishing the bottom side of the module until exposing the passive face of the silicon chip;
4) immersing the resulting module in hot fuming nitric acid at a temperature comprised between approximately 80° C. and 150° C. for a time comprised between approximately 4 and 10 minutes;
5) immediately cooling the resulting module to create a thermal shock whereby all the remaining portions of the plastic encapsulating resin are eliminated, leaving the desired bare silicon chip.

After possibly a final cleaning step, the chip is ready for analysis.

Optionally, should an electrical test be required, the ball-shaped connections may be in turn eliminated, by dipping the chip in a mercury bath to expose the chip contact zones.

In a preferred embodiment, the thermal shock is created by immersing the module in pure hot fuming nitric acid at 120° C. for 8 minutes and then cooling the module by blowing compressed ambient temperature air onto the chip.

The method of the present invention allows complete removal of the plastic encapsulating resin without damaging the chip and in particular its passivation layer, thereby preserving the chip functionality. Because, there is no longer any remaining plastic encapsulating resin coating over the central area of the chip, chip testability is maximized (100%).

The novel features believed to be characteristic of this invention are set forth in the appended claims. The invention itself, however, as well as other objects and advantages thereof, may best be understood by reference to the following detailed description of an illustrated preferred embodiment to be read in conjunction with the accompanying drawings.

DESCRIPTION OF THE PREFERRED EMBODIMENT

A preferred embodiment of the method of the present invention will be now described in conjunction with FIG. 4 which illustrates the different processing steps thereof.

Figure 4A:
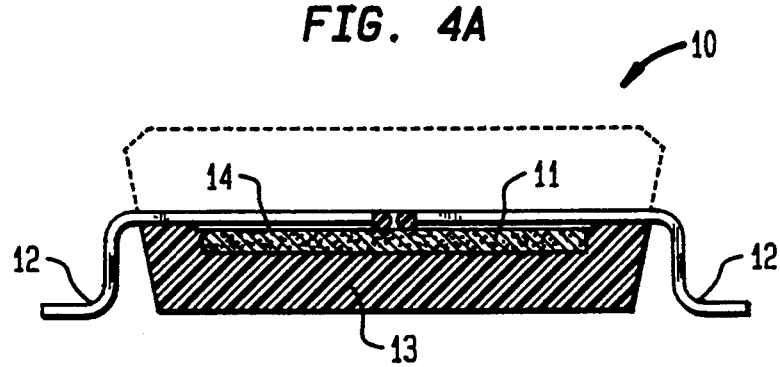
FIGS. 4(A)–4(D) show the module of FIG. 1 at different stages of the process according to a preferred embodiment of the method of the present invention.

1) The module 10 is secured in a fixture which is manually held or is fixed to the arm of the polishing apparatus. The module is presented to the polishing disk being turned upside down. The top surface of the module 10 is polished on a revolving diamond metal disk having a granularity from approximately 120 to 200 microns to remove the top of the plastic encapsulating resin 13. The polishing is continued until the metallic lead frame conductors 12 of the are exposed. Operating conditions are the same as those given above with respect to the corresponding step of the conventional method. FIG. 4(A) illustrates the module 10 at this stage of the process.

Figure 4B:
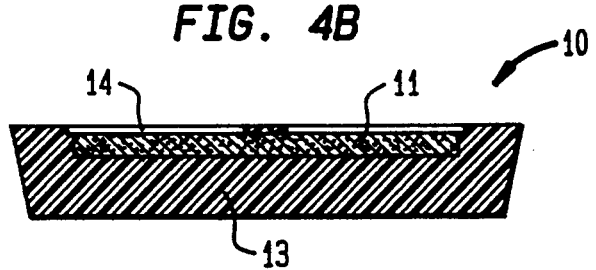

2) As apparent from FIG. 4(B), the lead frame is removed in the conventional manner using tweezers. Optionally, the module top surface may be now submitted to a fine additional polishing step to remove traces of the glue beneath the lead frame.

Above steps 1 and 2 are essentially identical to the corresponding steps of the conventional opening method described above. However, step 1 does not need to be carefully monitored. It doesn't matter if the lead frame is damaged or not. As a matter of fact, it is even permitted to proceed down to the "KAPTON" sheet 14b (see FIG. 1).

Figure 4C:
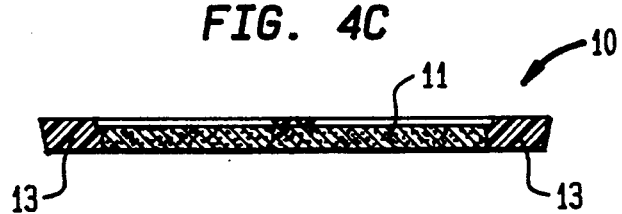

3) Then, according to the teachings of the present invention, a rough polishing is accomplished on the bottom of the module 10, using similar operating conditions as taught in step 1). A disk granularity of 120 um is adequate to remove the plastic encapsulating resin 13 until the passive face of the silicon chip 11 is exposed. Monitoring can be performed either automatically, e.g. by measuring the thickness of the remaining resin or by optical detection. At the end of step 3, the module is shown in FIG. 4(C).

4) Now, still according to the teachings of the present invention, the essential step of creating a thermal shock to the module is performed. This thermal shock is preferably accomplished in three successive heating, cooling and heating sub-steps.

According to sub-step 4-1, the module is immersed in a hot fuming pure nitric acid bath contained in a container disposed on a heating plate raised at a temperature of approximately 120° C. The duration of this sub-step is about 8 minutes. Although, in some instances, heating alone may reveal to be sufficient, use of fuming nitric acid has demonstrated to be very efficient since it cooperates with heat to produce a total removal of the plastic resin 13 at the end of this step, as it will be explained now.

In sub-step 4-2, the heated module 10 is without delay submitted to a quick cooling. For instance, a compressed gas e.g. air or a neutral gas, either cooled or at ambient temperature is blown over the module. At the end of sub-step 4-2, all or almost all the remaining plastic resin parts burst, just leaving the bare chip without any damage.

In sub-step 4-3, the chip is immersed once again in hot fuming nitric acid. This step is preferably conducted for a total removal of any plastic residues that could remain at this stage of the method. The temperature of the heating plate is still about 120° C. and the duration approximately 3–4 minutes.

Figure 4D:
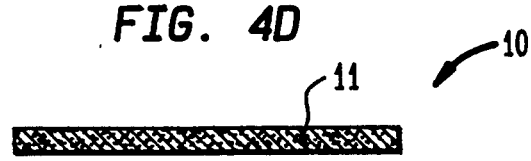
Figure 5A:
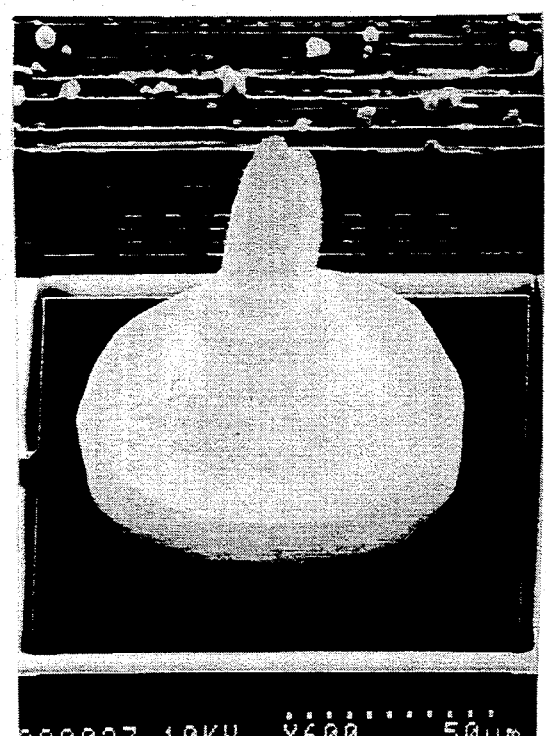
FIGS. 5(A) and (B) are micro-photographs showing enlarged views of the chip terminal connection system before and after the gold ball-shaped connection has been removed.

Finally, the bare chip is rinsed in de-ionized water, then cleaned in a conventional manner by using a duplicating film dipped in acetone. The chip is now ready for chip inspection/analysis. At this stage of the process, the bare chip is recovered undamaged as illustrated in FIG. 4(D). From the micro-photograph of FIG. 5(A), it is apparent that, in contrast to the above described conventional method, the chip terminal connection system is not deteriorated.

Figure 1C:
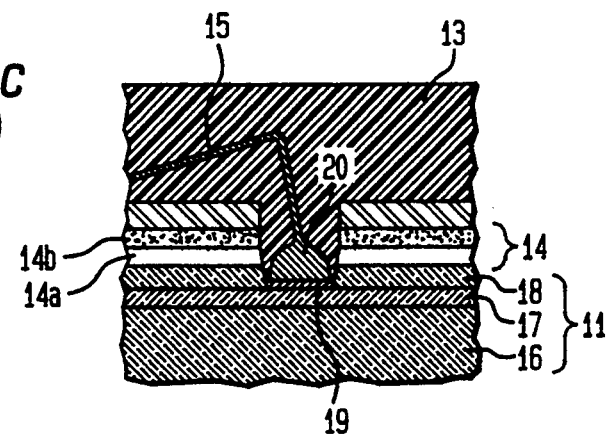
FIG. 1 shows a conventional plastic packaged module of the SOJ (Small Outline J-Lead) model wherein a silicon chip is molded.
FIG. 1(A) shows a cutaway view of the plastic packaged module with a part of the plastic encapsulation removed, (B) shows a cross sectional view of the module, and (C) shows a schematic enlarged view at the vicinity of the chip terminal connection system.
Figure 1A:
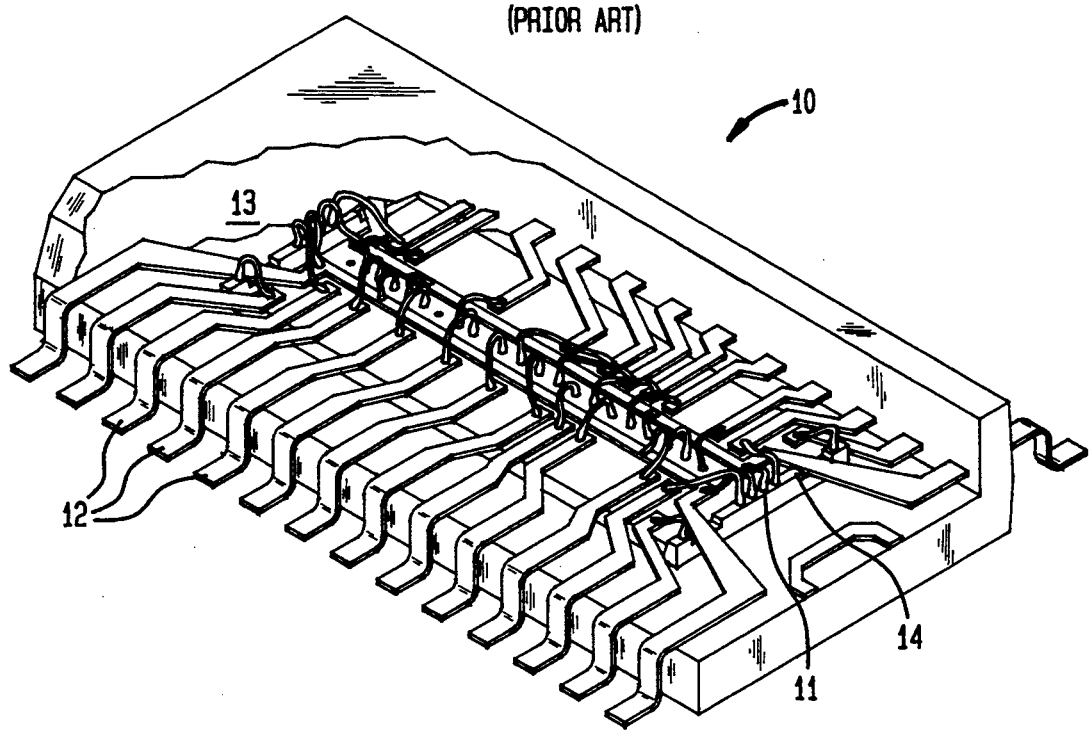
Figure 1B:
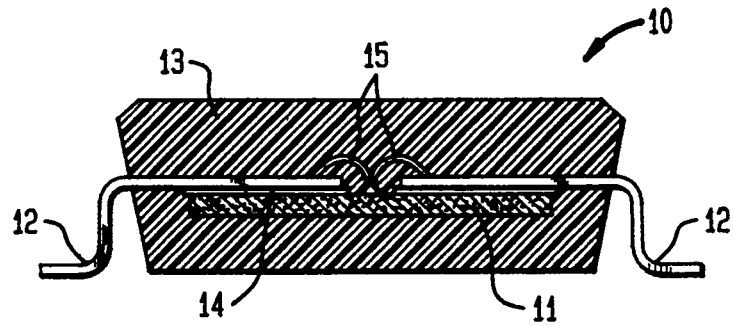
Figure 2A:
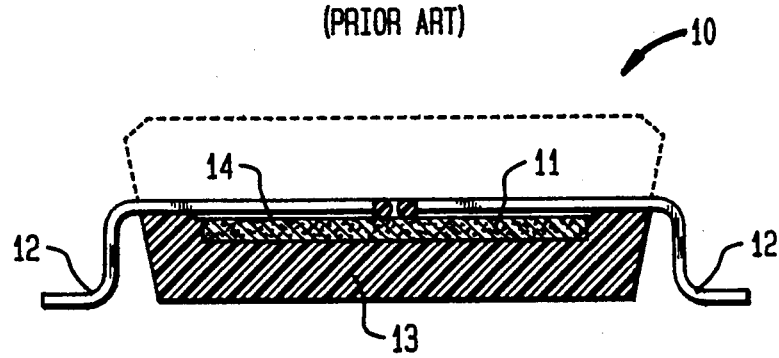
FIGS. 2(A)–2(D) show the module of FIG. 1 at different stages of the process according to a conventional method of the prior art for recovering the bare chip from the plastic packaged module.
Figure 2B:
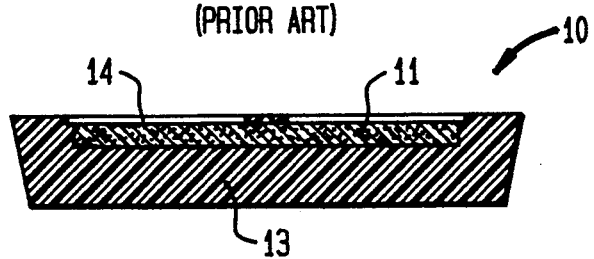
Figure 2C:
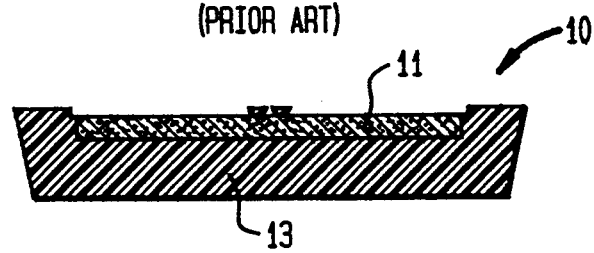
Figure 2D:
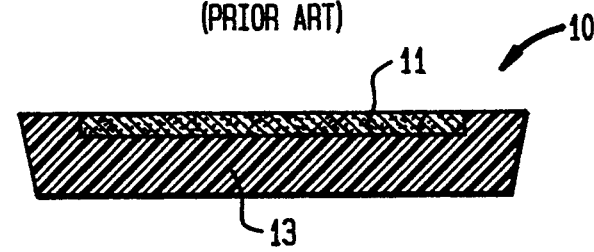
Figure 3A:
FIGS. 3(A) and (B) are micro-photographs showing enlarged views of the chip terminal connection system before and after the plasma etching step according to said conventional method.
Figure 3B:
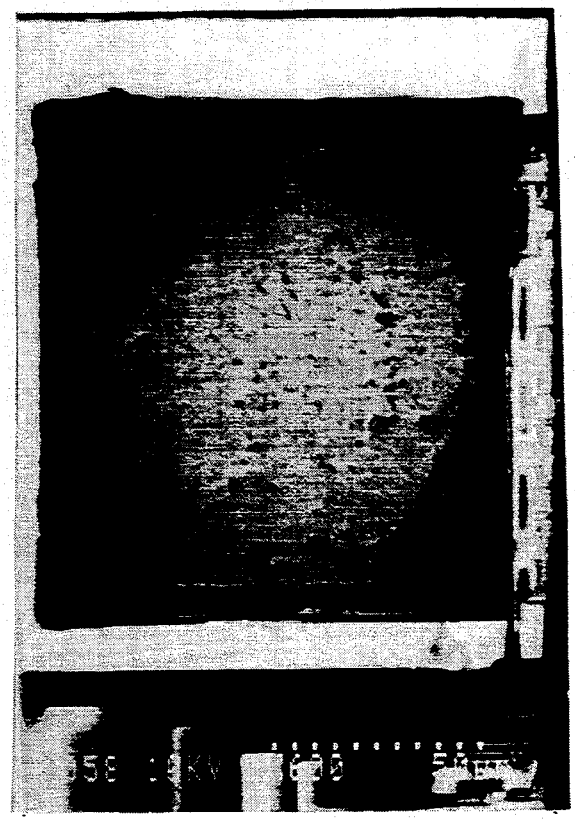
Figure 5B:
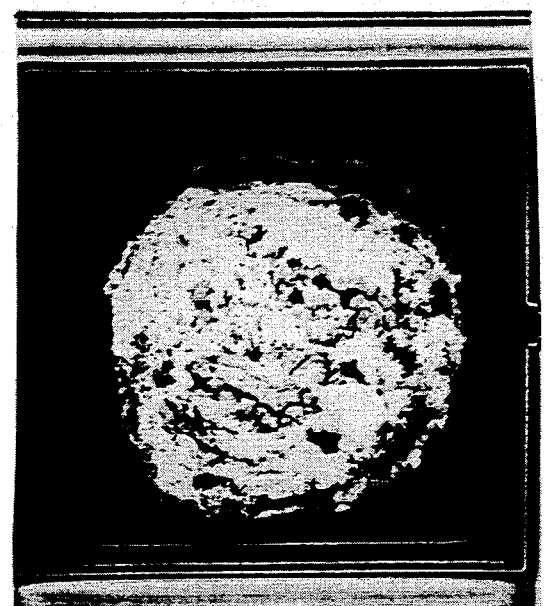

5) Should the chip testing be now required, the gold ball-shaped connections must be removed. To that end, the chip 11 is laid-down (active face down) to float over an agitated mercury bath, whose agitation is maintained during a limited period of time (e.g. for about 45 minutes), so that the remaining portions of the gold wires 15 and ball-shaped connections 20 as identified in FIG. 1 are not totally eliminated, just leaving a thin gold plated chip portion thereof exposed as apparent from the micro-photograph of FIG. 5(B). This step is highly desired to improve chip testability, because otherwise it would be really difficult to contact the remaining portion of the terminal connection system illustrated in FIG. 5(A) with a probe tip. On the contrary, it is very easy to apply a probe tip on the exposed contact zone which is relatively flat and large. Finally, the chip 11 is cleaned by using a duplicating film (acetylcellulose) in a conventional manner.

The method of the present invention, allows the removal of any type of plastic encapsulating resin if the integrated circuit chips are passivated with SiO2 or Si3N4. The present method is not adapted to polyimide passivated chips. Chip recovered from plastic packaged modules by the method of the present invention exhibit 100% functionality and testability. In particular, the chip contact zones have not been degraded and are ready for perfect electrical contact with the test probes. In addition, no physical or electrical degradation has been noticed as to the functionality of the chips. The opening method of the present invention reveals to be very useful as far as the recovered bare chips are used for examination/inspection or failure analysis purposes. However, it is also of great interest when the chips are recovered for re-use, possibly after having been repaired. With regard to the prior art method, the present method maintains the integrity of the chip terminal connection system. In addition, the chip is free of any contamination (no plastic residues). The present opening method is relatively simple, inexpensive (no RIE etcher required) and has demonstrated success rates as high as 100%.

The method of the present invention is applicable to plastic packaged modules of many types such as the Small Outline J-Lead (SOJ) packages, the Plastic Leaded Chip Carrier packages (PLCC), the Small Outline Package (SOP) and the like. The above opening method is also directly applicable to many other types of electronic components.

The invention claimed is:

1. A method for recovering an undamaged bare semiconductor chip from a plastic packaged module, the plastic packaged module molded of a plastic encapsulating resin which is etch resistant to fuming nitric acid and having a plurality of lead frame conductors, the chip having an active surface facing a first side of the plastic packaged module and a passive surface facing an opposing second side of the plastic packaged module, the active surface having a plurality of contact zones connected by a metal wire to the lead frame conductors, the recovering method comprising the steps of:
   a) polishing the first side of the plastic packaged module until the lead frame conductors are exposed;
   b) removing the lead frame conductors;
   c) polishing the second opposing side of the plastic packaged module until the passive surface of the semiconductor chip is exposed, leaving a polished module;
   d) heating the polished module to a temperature above approximately 80° C. without detrimentally affecting the semiconductor chip functionality and leaving a heated module; and
   e) cooling the heated module to create a thermal shock so that all the remaining portions of the plastic encapsulating resin are eliminated, leaving the desired bare semiconductor chip.

2. The method of claim 1 further including the step of:
   f) eliminating the wire at the vicinity of the semiconductor chip contact zones.

3. The method of claim 1 wherein said step d) of heating the polished module comprises immersing the polished module in a bath of hot fuming nitric acid raised to a temperature between about 80° C. and about 150° C. for a time between about 4 minutes and about 10 minutes.

4. The method of claim 1 wherein step e) comprises blowing compressed ambient temperature air onto the semiconductor chip.

5. The method of claim 2 wherein step f) comprises dipping the semiconductor chip in an agitated mercury bath for about 45 minutes.

6. The method of claim 1 wherein:
   step d) comprises immersing the polished module in a bath of hot fuming nitric acid raised to a temperature between about 80° C. and 150° C. for a time between about 4 minutes and about 10 minutes; and
   step e) comprises blowing compressed ambient temperature air onto the semiconductor chip.

7. The method of claim 2 wherein said step d) of heating the polished module comprises immersing the polished module in a bath of hot fuming nitric acid raised to a temperature between about 80° C. and about 150° C. for a time between about 4 minutes and about 10 minutes.

8. The method of claim 2 wherein step e) comprises blowing compressed ambient temperature air onto the semiconductor chip.

9. The method of claim 2 wherein:

step d) comprises immersing the polished module in a bath of hot fuming nitric acid raised to a temperature between about 80° C. and 150° C. for a time between about 4 minutes and about 10 minutes; and step e) comprises blowing compressed ambient temperature air onto the semiconductor chip.

10. The method of claim 2 wherein:

step d) comprises immersing the polished module in a bath of hot fuming nitric acid raised to a temperature between about 80° C. and 150° C. for a time between about 4 minutes and about 10 minutes; and step f) comprises dipping the semiconductor chip in an agitated mercury bath for about 45 minutes.

11. The method of claim 2 wherein:

step e) comprises blowing compressed ambient air onto the semiconductor chip; and step f) comprises dipping the semiconductor chip in an agitated mercury bath for about 45 minutes.

12. The method of claim 2 wherein:

step d) comprises immersing the polished module in a bath of hot fuming nitric acid raised to a temperature between about 80° C. and 150° C. for a time between about 4 minutes and about 10 minutes;

step e) comprises blowing compressed ambient air onto the semiconductor chip; and step f) comprises dipping the semiconductor chip in an agitated mercury bath for about 45 minutes.

13. A method for recovering an undamaged bare semiconductor chip from a plastic packaged module, the plastic packaged module molded of a plastic encapsulating resin which is etch resistant to fuming nitric acid and having a plurality of lead frame conductors, the chip having an active surface facing a first side of the plastic packaged module and a passive surface facing an opposing second side of the plastic packaged module, the active surface having a plurality of contact zones connected by a metal wire to the lead frame conductors, the recovering method comprising the steps of:

a) polishing the second opposing side of the plastic packaged module until the passive surface of the semiconductor chip is exposed;

b) polishing the first side of the plastic packaged module until the lead frame conductors are exposed, leaving a polished module;

c) removing the lead frame conductors;

d) heating the polished module to a temperature above approximately 80° C. without detrimentally affecting the semiconductor chip functionality and leaving a heated module; and e) cooling the heated module to create a thermal shock so that all the remaining portions of the plastic encapsulating resin are eliminated, leaving the desired bare semiconductor chip.

14. The method of claim 13 wherein said step d) of heating the polished module comprises immersing the polished module in a bath of hot fuming nitric acid raised to a temperature between about 80° C. and about 150° C. for a time between about 4 minutes and about 10 minutes.

15. The method of claim 13 wherein step e) comprises blowing compressed ambient temperature air onto the semiconductor chip.

16. The method of claim 13 wherein:

step d) comprises immersing the polished module in a bath of hot fuming nitric acid raised to a temperature between about 80° C. and 150° C. for a time between about 4 minutes and about 10 minutes; and step e) comprises blowing compressed ambient temperature air onto the semiconductor chip.

17. The method of claim 13 further including the step of:

f) eliminating the wire at the vicinity of the semiconductor chip contact zones.

18. The method of claim 17 wherein said step d) of heating the polished module comprises immersing the polished module in a bath of hot fuming nitric acid raised to a temperature between about 80° C. and about 150° C. for a time between about 4 minutes and about 10 minutes.

19. The method of claim 17 wherein step e) comprises blowing compressed ambient temperature air onto the semiconductor chip.

20. The method of claim 17 wherein step f) comprises dipping the semiconductor chip in an agitated mercury bath for about 45 minutes.

21. The method of claim 17 wherein:

step d) comprises immersing the polished module in a bath of hot fuming nitric acid raised to a temperature between about 80° C. and 150° C. for a time between about 4 minutes and about 10 minutes; and step e) comprises blowing compressed ambient temperature air onto the semiconductor chip.

22. The method of claim 17 wherein:

step d) comprises immersing the polished module in a bath of hot fuming nitric acid raised to a temperature between about 80° C. and 150° C. for a time between about 4 minutes and about 10 minutes; and step f) comprises dipping the semiconductor chip in an agitated mercury bath for about 45 minutes.

23. The method of claim 17 wherein:

step e) comprises blowing compressed ambient air onto the semiconductor chip; and step f) comprises dipping the semiconductor chip in an agitated mercury bath for about 45 minutes.

24. The method of claim 17 wherein:

step d) comprises immersing the polished module in a bath of hot fuming nitric acid raised to a temperature between about 80° C. and 150° C. for a time between about 4 minutes and about 10 minutes;

step e) comprises blowing compressed ambient air onto the semiconductor chip; and step f) comprises dipping the semiconductor chip in an agitated mercury bath for about 45 minutes.

* * * * *